United States Patent [19]

Nagel et al.

[11] 4,184,078

[45] Jan. 15, 1980

[54] PULSED X-RAY LITHOGRAPHY

[75] Inventors: David J. Nagel, Falls Church, Va.; Martin C. Peckerar, Bowie, Md.

[73] Assignee: The United States of America as represented by the Secretary of the Navy, Washington, D.C.

[21] Appl. No.: 933,928

[22] Filed: Aug. 15, 1978

[51] Int. Cl.² ............................................. G03B 41/16
[52] U.S. Cl. ................................. 250/492 A; 250/493
[58] Field of Search ............... 250/492 A, 492 R, 493

[56] References Cited

U.S. PATENT DOCUMENTS

| 3,742,229 | 6/1973 | Smith et al. | 250/492 A |
| 3,743,842 | 7/1973 | Smith et al. | 250/492 A |
| 3,969,628 | 7/1976 | Roberts et al. | 250/492 R |
| 4,028,547 | 6/1977 | Eisenberger | 250/492 A |
| 4,058,486 | 11/1977 | Mallozzi et al. | 250/493 |
| 4,061,829 | 12/1977 | Taylor | 250/492 A |

Primary Examiner—Alfred E. Smith
Assistant Examiner—T. N. Grigsby
Attorney, Agent, or Firm—R. S. Sciascia; Philip Schneider; Melvin L. Crane

[57] ABSTRACT

A method and means for x-ray lithography which utilizes means for producing in a vacuum system a high-temperature plasma from which soft x-rays are emitted. The x-rays pass through a mask exposing an x-ray resist on a substrate to produce the desired pattern on the substrate. The x-ray spectrum has a significant energy in the 1–5 keV range. These x-rays pass through the support layer of the mask, stop in the pattern material (gold) of the mask or, where the pattern material is lacking, are absorbed adequately by the x-ray resist. Since there is very little energy above 5 keV, there is little if any substrate damage due to the x-rays.

10 Claims, 2 Drawing Figures

PULSED X-RAY LITHOGRAPHY

BACKGROUND OF THE INVENTION

This invention relates to lithography and more particularly to soft x-ray lithography.

Lithography is a process of replicating a pattern on a material. Heretofore lithograhy has been carried out by the use of electrons, light, ultraviolet radiation and x-ray radiation from electron impact and synchrotron sources. In photolithography, light is passed through a mask containing the pattern of interest to a substrate sensitive to light. Light suffers diffraction effects which degrade the replication when fine-scale (about 1 $\mu$m) features are present in the mask. X-rays have wavelengths sufficiently small that diffraction effects are negligible. In x-ray lighography, the mask consists of a thin sheet of x-ray-transparent material such as beryllium, silicon or a plastic-like substance supporting a pattern of x-ray absorbing material, usually gold. The substrate is coated with an x-ray sensitive material called x-ray resist. Electron-impact x-ray sources used in the prior art generally produce high-energy x-rays above 5 keV which are not stopped in the thin x-ray resist. Therefore the substrate is damaged. Synchrotron sources emit softer x-rays. However, these x-ray devices are expensive and usually very large and bulky so these are not suitable for routine production of x-ray lithographic replicas.

SUMMARY OF THE INVENTION

An x-ray lighography process which involves high-temperature plasma-generated x-rays, and a mask x-ray-resist substrate combination. The plasma is produced in a vacuum system. Laser or electrical energy is transmitted directly to a plasma-producing device and the plasma produced emits intense soft x-rays. The soft x-rays pass through the mask, exposing the x-ray resist on the substrate.

Advantages of the present system are: 1. The x-rays are in the 1-5 keV range and thus do not damage the substrate. 2. Plasmas emit intense short pulses of x-rays. Therefore exposure times are shorter. 3. The size of the plasma source is relatively small. 4. The x-ray emission covers a large solid angle. Hence, several mask resist substrate combinations may be exposed simultaneously. 5. The system costs less than others now in use for fine-line lithography.

DETAILED DESCRIPTION

Figure 1:
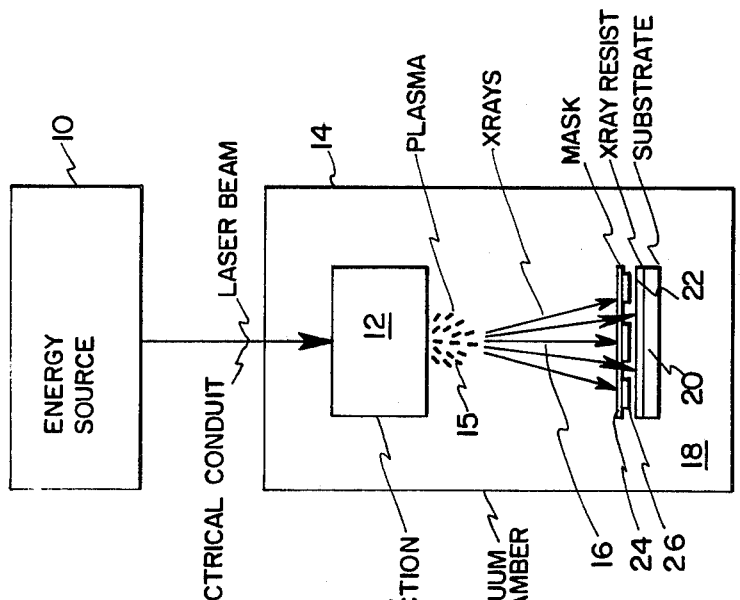
FIG. 1 illustrates a pulsed high-temperature plasma as an x-ray source for resist exposure.

FIG. 1 illustrates the components of one embodiment involved in pulsed x-ray lithograpy which uses a high-temperature plasma as a x-ray source. As shown, the energy from an energy storage device 10 such as a large capacitor bank is transmitted directly to a plasma-producing device 12 such as an explodedwire diode or a gas injection diode which produces a plasma 15 with a vacuum system 14. The temperature of the plasma 15 exceeds one million degrees and the plasma emits intense soft x-rays 16. The intense soft x-rays are incident on the image-replicating structure 18. The image-replicating structure includes a substrate 20 such as silicon, a layer of x-ray sensitive material called x-ray resist 22 on the substrate and a mask over the x-ray resist. The mask includes a supporting layer 24, such as beryllium which supports the pattern 26 which may be formed from a material such as gold. The soft x-rays incident on the support layer of the mask are stopped by the pattern material and pass through those areas lacking the pattern material. The x-rays that pass through are incident on and absorbed by the x-ray resist, thereby exposing the x-ray resist areas on the substrate. The mask is removed leaving the x-ray-exposed resist. The resist is chemically washed to remove the x-ray-exposed areas of the substrate resist (for positive resists) leaving the unexposed areas of the substrate protruding from the substrate, or the unexposed areas (for negative resists) leaving the exposed areas in place.

Figure 2:
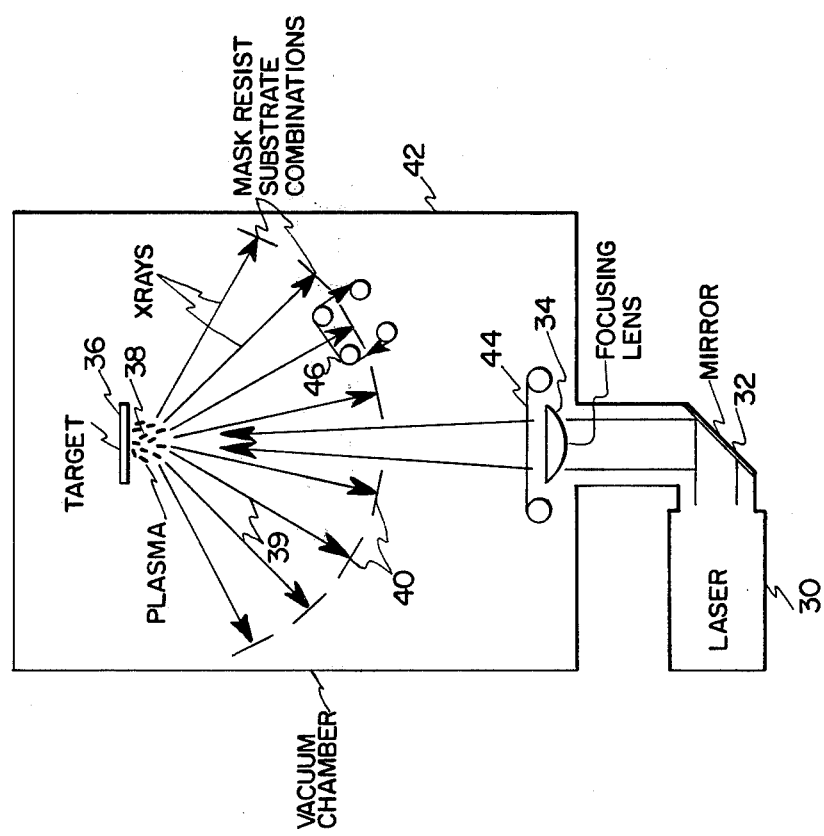
FIG. 2 illustrates a laser plasma x-ray source for simultaneous production of several replicas by x-ray lighography.

FIG. 2 illustrates a laser-plasma x-ray source for simultaneous production of several replicas by soft x-ray lithography. A laser 30, such as a pulsed neodymium (Nd) laser, directs its output beam onto a 45-degree, fully reflective mirror 32 which reflects the laser beam through a focusing lens 34 onto a target 36 at or near normal incidence. The target is of a suitable material such as copper which produces a plasma 38 due to the intense heat of the laser beam. The plasma emits soft x-rays 39 which are directed on to a plurality of mask x-ray resist substrate combinations 40 such as set forth above. The pattern is formed on the substrate as described above for the system shown in FIG. 1. The elements set forth in FIG. 2 are housed within a vacuum chamber 42 which is evacuated to a pressure of less than 100 microns prior to operation thereof.

The target may be a flat piece of material renewed by replacement or translation, or a wire, or rod, fed into place prior to each operation for forming patterns on the substrates. The focusing lens may be protected from the evaporated target material by use of a rolled piece of Mylar 44 or similar material which is between the lens and the target. Also the masks can be similarly protected as shown at 46.

The system set forth and shown above in FIGS. 1 and 2 illustrate the use of plasma-generated x-rays for lithographic forming patterns on a substrate. The use of x-rays permit one to form small-scale patterns useful for microelectronics, bubble computer memory and optoelectronics applications. Plasma sources as set forth above have x-ray-spectra energy from 1-5 keV with emission times less than one microsecond, and a source size less than 1 mm$^3$. Since the x-ray energy is from 1-5 keV range, the radiation incident on the gold pattern is stopped by the gold layer with the rest of the x-ray beam passing through the mask to the x-ray resist. The x-rays incident on the x-ray resist are absorbed by the x-ray resist without any damage to the underlying substrate.

It has been determined that plasma emits intense, short pulses of x-rays. Therefore, exposure times shorter than one microsecond are possible with presently known x-ray-resist materials.

Other means for producing plasmas useful in the present invention are high-temperature electrical sources, vaccum spark devices, electron-beam generators, as well as other types of plasma focus and implosive devices.

Obviously many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. A soft x-ray lithographic system which comprises:
   a housing;
   means for evacuating said housing;
   means for producing an x-ray-emitting plasma; and
   a mask x-ray-resist substrate combination for replicating a desired pattern on said substrate.

2. A soft x-ray lithographic system as claimed in claim 1 in which:
   said x-rays have an energy of from 1 to 5 keV, an emission time of less than 1 microsecond, and a source size of about 1 mm$^3$.

3. A lithographic system as claimed in claim 1 in which:
   said means for producing an x-ray-emitting plasma is a solid metal target upon which a pulsed laser beam is incident.

4. A lithographic system as claimed in claim 1 in which:
   said means for producing an x-ray-emitting plasma is a high electrical energy storage means in combination with a diode within said housing.

5. A lithographic system as claimed in claim 1 in which
   said means for producing an x-ray-emitting plasma is a laser beam focused onto a metal target within said housing.

6. A method of replicating a pattern on a material which comprises:
   placing a mask x-ray absorption pattern relative to an x-ray-resist substrate combination,
   placing said substrate combination into a housing;
   evacuating said housing;
   producing an x-ray-emitting plasma within said evacuated housing; and
   directing said x-rays onto said substrate combination.

7. A method as claimed in claim 6 wherein:
   said x-ray-emitting plasma is produced by focusing a pulsed laser output onto a metal target within said evacuated housing.

8. A method as claimed in claim 6 wherein:
   said x-ray-emitting plasma is produced by discharging a high electrical storage means through a diode within said housing.

9. A soft x-ray lithographic system comprising:
   means for producing a hot plasma at a temperature above 1 million degrees Celsius, the plasma being composed of matter which emits x-rays at such temperatures; and
   means for replicating an image comprising a substrate, a layer of x-ray-sensitive material on said substrate, and masking means between said sensitive layer and said plasma-producing means, said masking means containing a representation of the image to be replicated, said representation of the image being formed by the proper combination of areas that are opaque and areas that are transparent to the soft x-rays,
   said image being formed on the x-ray-resist by irradiation of the replicating means by the x-rays from the plasma-producing means.

10. A system as in claim 9, wherein said plasma-producing source comprises a laser and a target spaced therefrom, said target being made from a material which produces a plasma when struck by a laser beam.

* * * * *